(12) United States Patent
Kim et al.

(10) Patent No.: US 10,580,728 B2
(45) Date of Patent: Mar. 3, 2020

(54) FAN-OUT SEMICONDUCTOR PACKAGE

(71) Applicant: SAMSUNG ELECTRONICS CO., LTD., Suwon-si (KR)

(72) Inventors: Sung Han Kim, Suwon-si (KR); Masazumi Amagai, Suwon-si (KR); Ju Ho Kim, Suwon-si (KR); Tae Sung Jeong, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 221 days.

(21) Appl. No.: 15/457,260

(22) Filed: Mar. 13, 2017

(65) Prior Publication Data

US 2017/0372995 A1    Dec. 28, 2017

(30) Foreign Application Priority Data

Jun. 23, 2016 (KR) .................. 10-2016-0078874
Jul. 26, 2016 (KR) .................. 10-2016-0094614

(51) Int. Cl.
*H01L 23/498* (2006.01)
*H01L 23/00* (2006.01)

(52) U.S. Cl.
CPC ........ *H01L 23/49838* (2013.01); *H01L 24/06* (2013.01); *H01L 24/14* (2013.01); *H01L 23/49816* (2013.01); *H01L 2224/0401* (2013.01)

(58) Field of Classification Search
CPC ............... H01L 23/49838; H01L 2224/02379
See application file for complete search history.

(56) References Cited

U.S. PATENT DOCUMENTS

| | | | |
|---|---|---|---|
| 2002/0084107 A1 | 7/2002 | Chang et al. | |
| 2008/0185719 A1 | 8/2008 | Cablao et al. | |
| 2012/0013021 A1 | 1/2012 | Kobayashi et al. | |
| 2013/0249106 A1 | 9/2013 | Lin et al. | |
| 2014/0103527 A1 | 4/2014 | Marimuthu et al. | |
| 2016/0037646 A1 | 2/2016 | Lee et al. | |
| 2016/0233166 A1* | 8/2016 | Teh | H01L 24/19 |
| 2016/0322332 A1* | 11/2016 | Kim | H01L 23/16 |

FOREIGN PATENT DOCUMENTS

| | | |
|---|---|---|
| JP | 2009-055019 A | 3/2009 |
| JP | 2012-039090 A | 2/2012 |
| KR | 2002-0054474 A | 7/2002 |
| KR | 10-2008-0073677 A | 8/2008 |
| KR | 10-2009-0118705 A | 11/2009 |
| KR | 10-2011-0114165 A | 10/2011 |
| KR | 10-2013-0132162 A | 12/2013 |
| KR | 10-2016-0016215 A | 2/2016 |
| KR | 10-2016-0024379 A | 3/2016 |

OTHER PUBLICATIONS

Korean Office Action issued in corresponding Application No. 10-2016-0094614 dated Jul. 20, 2018 (with English translation).
Taiwanese Office Action issued in corresponding Taiwanese Patent Application No. 106107302, dated Jul. 9, 2018, with English Translation.

* cited by examiner

*Primary Examiner* — Yu-Hsi D Sun
(74) *Attorney, Agent, or Firm* — Sughrue Mion, PLLC

(57) ABSTRACT

A fan-out semiconductor package includes connection pads of a semiconductor chip that are redistributed and electrically connected to connection terminals by an interconnection member. In the fan-out semiconductor package, disposition forms of vias and pads in the interconnection member are designed so that stress may be reduced, such that reliability is improved.

23 Claims, 14 Drawing Sheets

A

US 10,580,728 B2

FAN-OUT SEMICONDUCTOR PACKAGE

CROSS-REFERENCE TO RELATED APPLICATION(S)

This application claims the benefit of priority to Korean Patent Application Nos. 10-2016-0094614 filed on Jul. 26, 2016 and 10-2016-0078874 filed on Jun. 23, 2016 in the Korean Intellectual Property Office, the entire disclosure of which is incorporated herein by reference.

BACKGROUND

1. Field

The present disclosure relates to a semiconductor package, and more particularly, to a fan-out semiconductor package in which connection terminals may extend outwardly of a region in which a semiconductor chip is disposed.

2. Description of Related Art

A significant recent trend in the development of technology related to semiconductor chips has been to reduce the size of semiconductor chips. Therefore, in the case of package technology, in accordance with a rapid increase in demand for small-sized semiconductor chips, or the like, the implementation of a semiconductor package having a compact size while including a plurality of pins has been demanded.

One type of package technology suggested to satisfy the technical demand described above is a fan-out package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which reliability of a via may be improved.

One of several solutions suggested through the present disclosure is to dispose vias and pads in an interconnection member redistributing connection pads of a semiconductor chip and connecting the connection pads of the semiconductor chip to connection terminals so that stress may be reduced.

According to an aspect of the present disclosure, a fan-out semiconductor package may include: a first interconnection member having a through-hole; a semiconductor chip disposed in the through-hole of the first interconnection member and having an active surface having a connection pad disposed thereon and an inactive surface opposing the active surface; an encapsulant encapsulating at least portions of the first interconnection member and the inactive surface of the semiconductor chip; a second interconnection member disposed on the first interconnection member and the active surface of the semiconductor chip; and a connection terminal disposed on the second interconnection member. The first interconnection member and the second interconnection member respectively include redistribution layers electrically connected to the connection pads of the semiconductor chip, and a connection pad and a connection terminal are electrically connected to each other by an electrical pathway in the second interconnection member, the electrical pathway including a first via connected to the connection pad and having a central axis disposed in an inner region of a connection terminal pad connected to the connection terminal and a second via connected to a via pad formed on the layer on which the connection terminal pad is disposed and having a central axis disposed in an outer region of the connection terminal pad.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
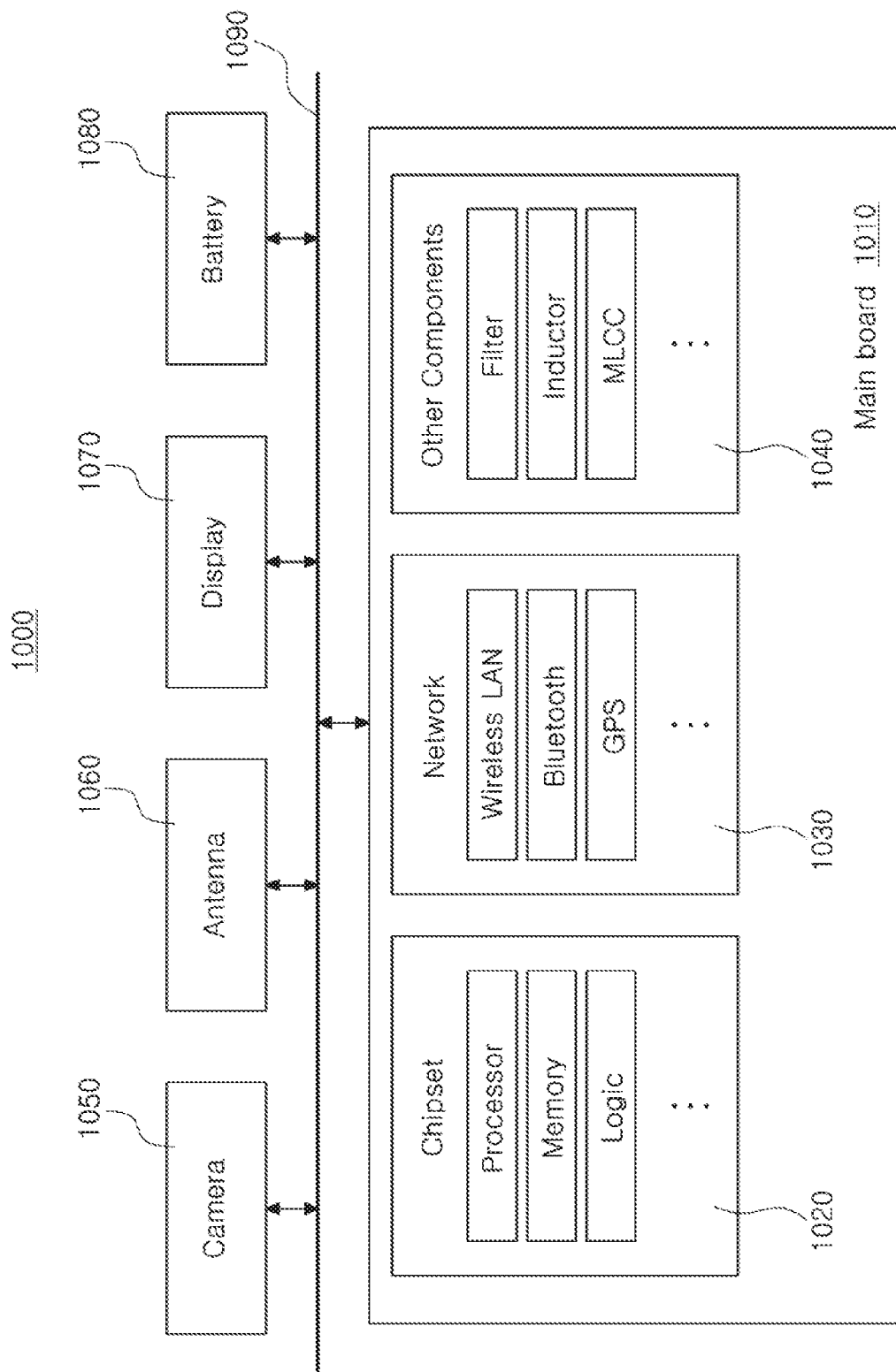
FIG. 1 is a schematic block diagram illustrating an example of an electronic device system.

Hereinafter, exemplary embodiments in the present disclosure will be described with reference to the accompanying drawings. In the accompanying drawings, shapes, sizes, and the like, of components may be exaggerated or omitted for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are as depicted in the attached drawings. For example, a first interconnection member is disposed at a level above a second interconnection member. However, the claims are not limited thereto. In the present disclosure, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mother board 1010 therein. The mother board 1010 may include chip-related components 1020, network-related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, the chip-related components 1020 may be combined with each other.

The network-related components 1030 may be compatible with protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. However, these other components are not limited thereto, and may also include other components used for various purposes depending on type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
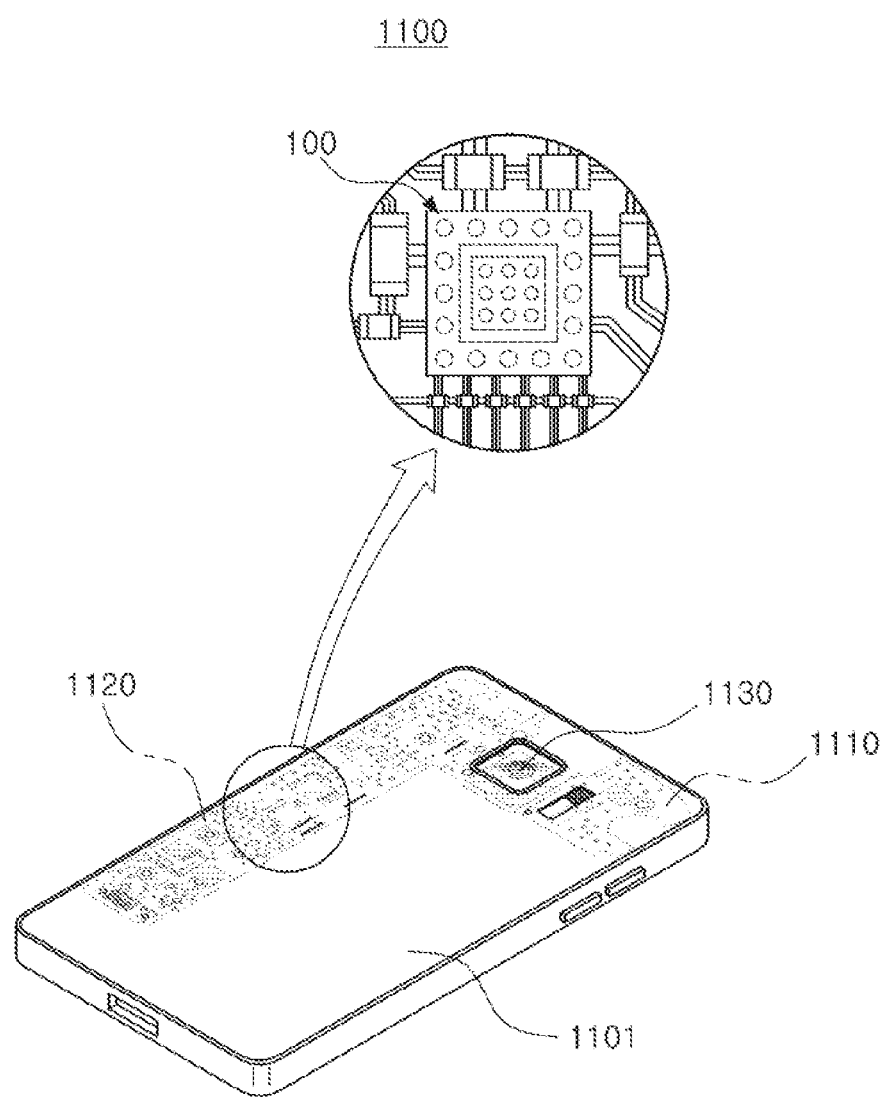
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1130, may be accommodated in the body 1101. Some of the electronic components 1120 may be the chip-related components, and the semiconductor package 100 may be, for example, an application processor among the chip-related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in circuit widths between the semiconductor chip and a main board of the electronic device in terms of electrical connections. In detail, a size of connection pads of the semiconductor chip and intervals between the connection pads of the semiconductor chip are very fine, while sizes of component mounting pads of the main board used in the electronic device and intervals between the component mounting pads of the main board are significantly larger than those of the semiconductor chip. Therefore, it may be difficult to directly mount the semiconductor chip on the main board, and packaging technology for buffering a difference in circuit widths between the semiconductor chip and the main board is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
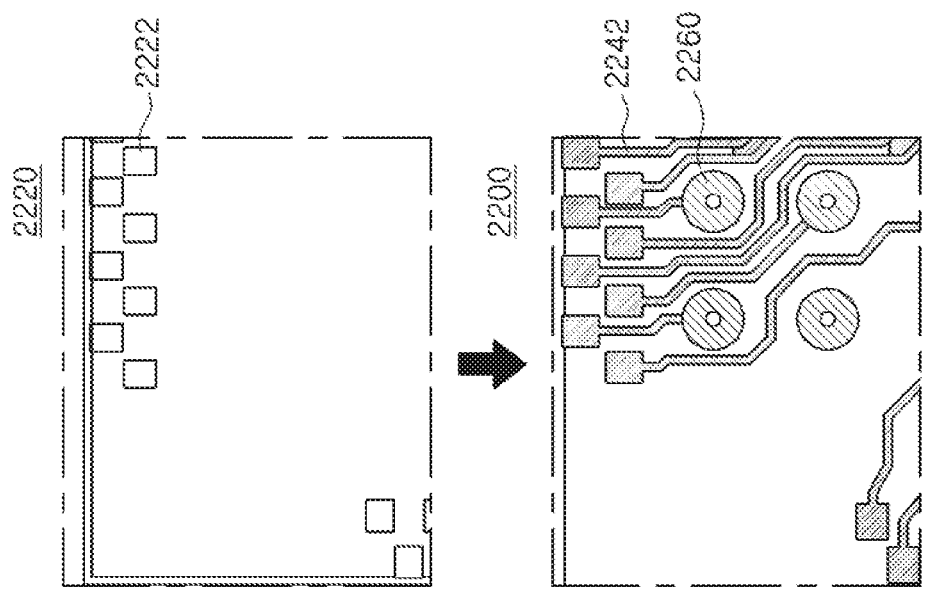
FIGS. 3A and 3B are schematic cross-sectional views illustrating states of a fan-in semiconductor package before and after being packaged.
Figure 3A:
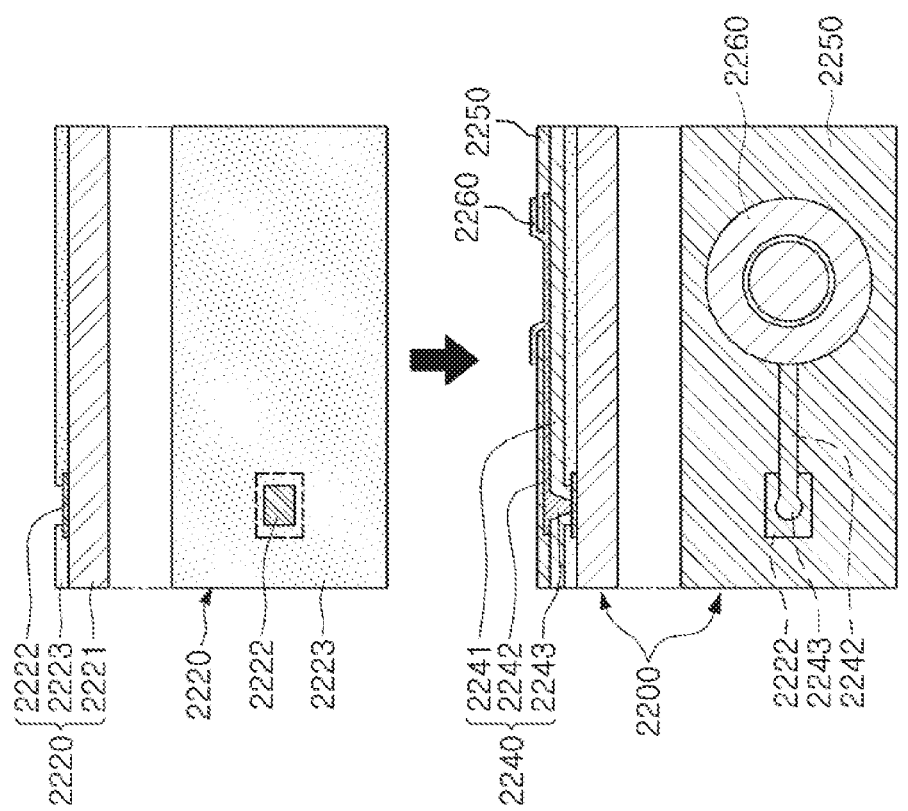

FIGS. 3A and 3B are schematic cross-sectional views illustrating states of a fan-in semiconductor package before and after being packaged.

Figure 4:
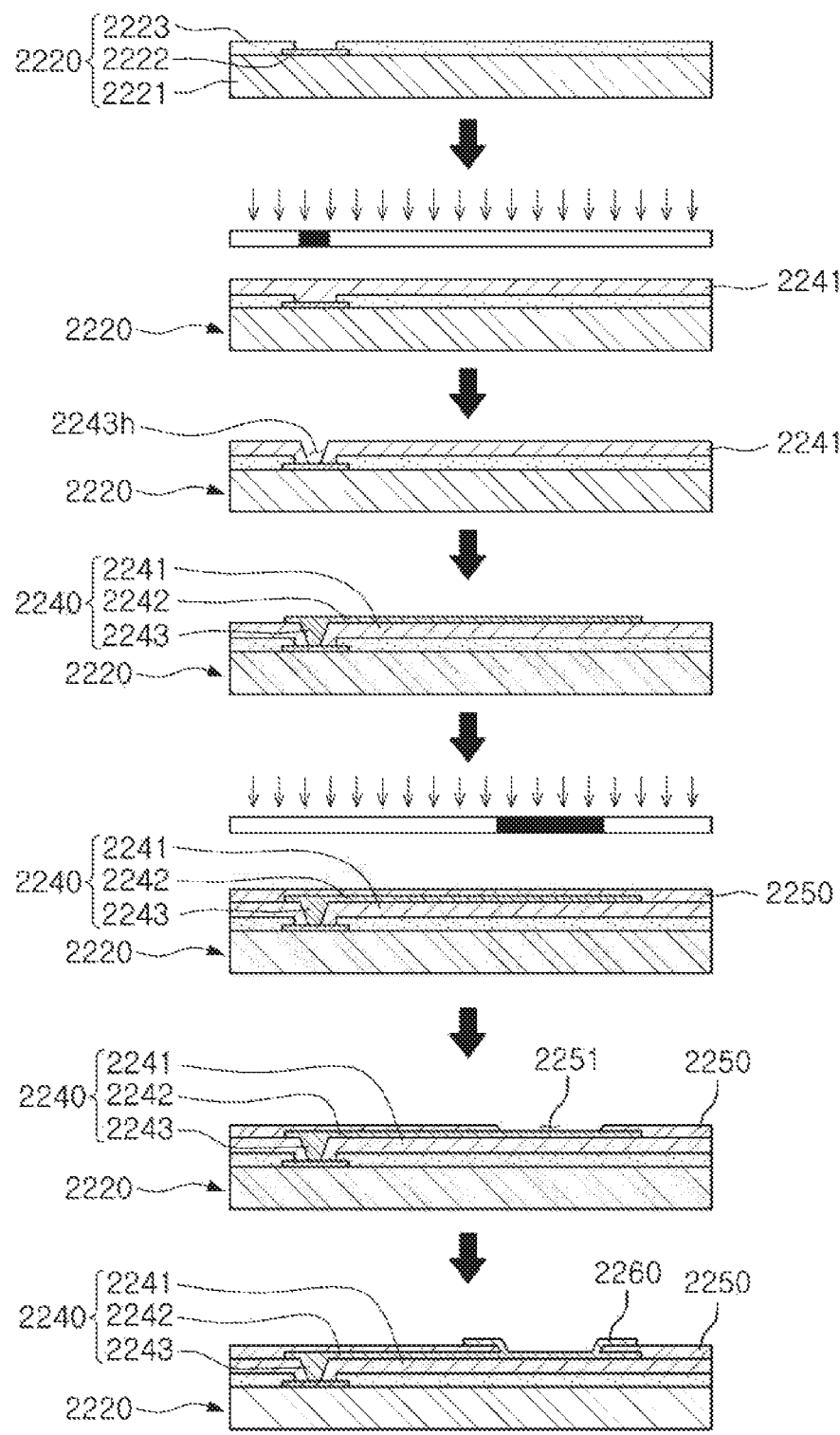
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the main board of the electronic device, or the like.

Therefore, a interconnection member 2240 may be formed on the semiconductor chip 2220 depending on a size thereof in order to redistribute the connection pads 2222. The interconnection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the interconnection member 2240 may be formed, an opening 2251 may be formed, and an under-bump metal layer 2260, or the like, may be formed. That is, a fan-in semiconductor package 2200 including, for example, the semiconductor chip 2220, the interconnection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, may have excellent electrical characteristics and may be produced at a low cost. Therefore, many elements mounted in smartphones have been manufactured in fan-in semiconductor package form. In detail, many elements mounted in smartphones have been developed to allow rapid signal transfer to be implemented while having a compact size.

However, since all I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. Here, even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
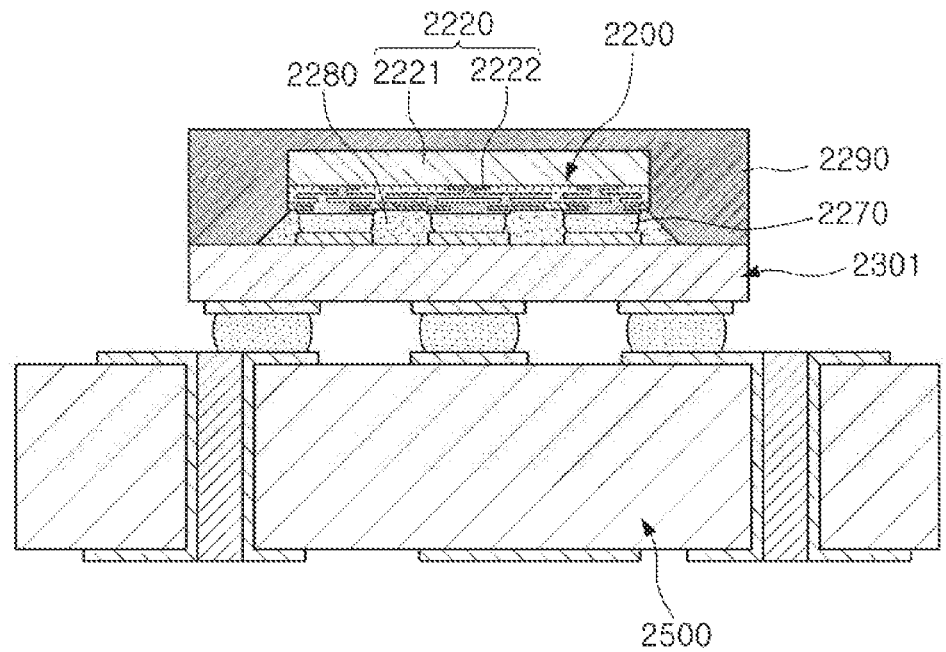
FIG. 5 is a schematic cross-sectional view illustrating a case in which a fan-in semiconductor package is mounted on an interposer substrate and is ultimately mounted on a main board of an electronic device.

FIG. 5 is a schematic cross-sectional view illustrating a case in which a fan-in semiconductor package is mounted on an interposer substrate and is ultimately mounted on a main board of an electronic device.

Figure 6:
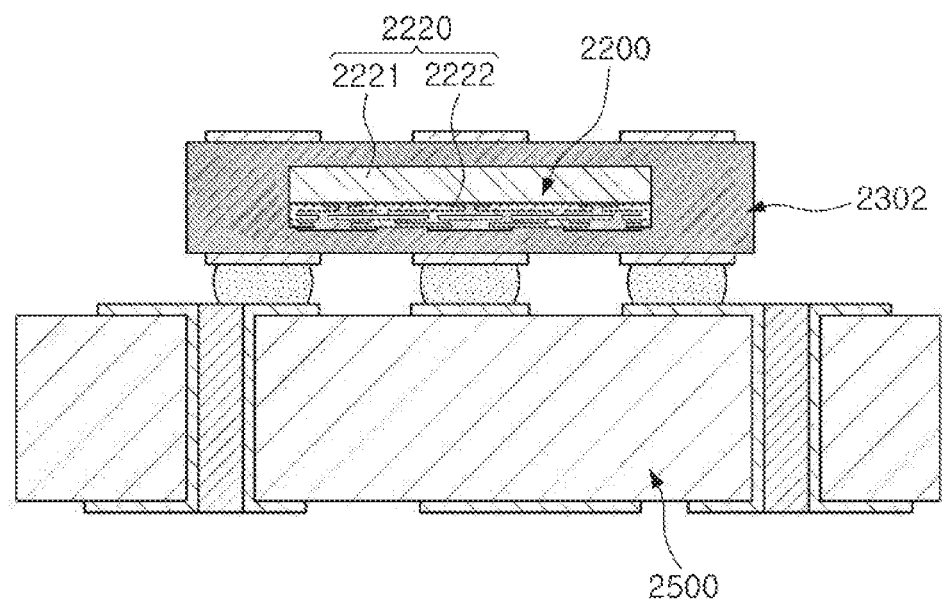
FIG. 6 is a schematic cross-sectional view illustrating a case in which a fan-in semiconductor package is embedded in an interposer substrate and is ultimately mounted on a main board of an electronic device.

FIG. 6 is a schematic cross-sectional view illustrating a case in which a fan-in semiconductor package is embedded in an interposer substrate and is ultimately mounted on a main board of an electronic device.

Referring to the drawings, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a main board 2500 of an electronic device in a state of being mounted on the interposer substrate 2301. In this case, solder balls 2270, and the like, may be fixed by an underfill resin 2280, or the like, and an external surface of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
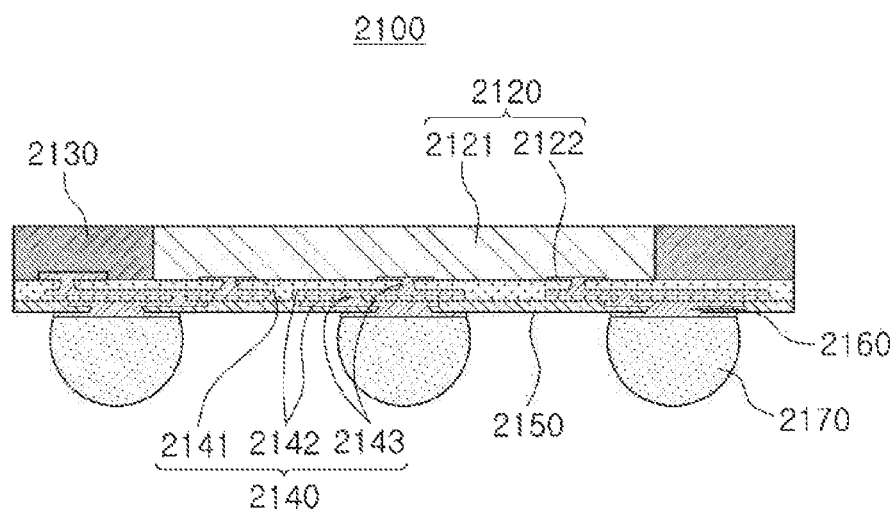
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a interconnection member 2140. In this case, a passivation layer 2150 may further be formed on the interconnection member 2140, and an under-bump metal layer 2160 may further be formed in openings of the passivation layer 2150. Solder balls 2170 may further be formed on the under-bump metal layer 2160. The semiconductor chip 2120 may be an integrated circuit (IC) including a body 2121, the connection pads 2122, a passivation layer, and the like. The interconnection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the interconnection member formed on the semiconductor chip. As described above, in the fan-in semiconductor package, all I/O terminals of the semiconductor chip need to be disposed inside the semiconductor chip. Therefore, when a size of the semiconductor chip is reduced, a size and a pitch of balls need to be reduced, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the interconnection member formed on the semiconductor chip as described above. Therefore, even in the case that a size of the semiconductor chip is reduced, a standardized ball layout may be used in the fan-out semiconductor package as it is, such that the fan-out semiconductor package may be mounted on the main board of the electronic device without using a separate interposer substrate, as described below.

Figure 8:
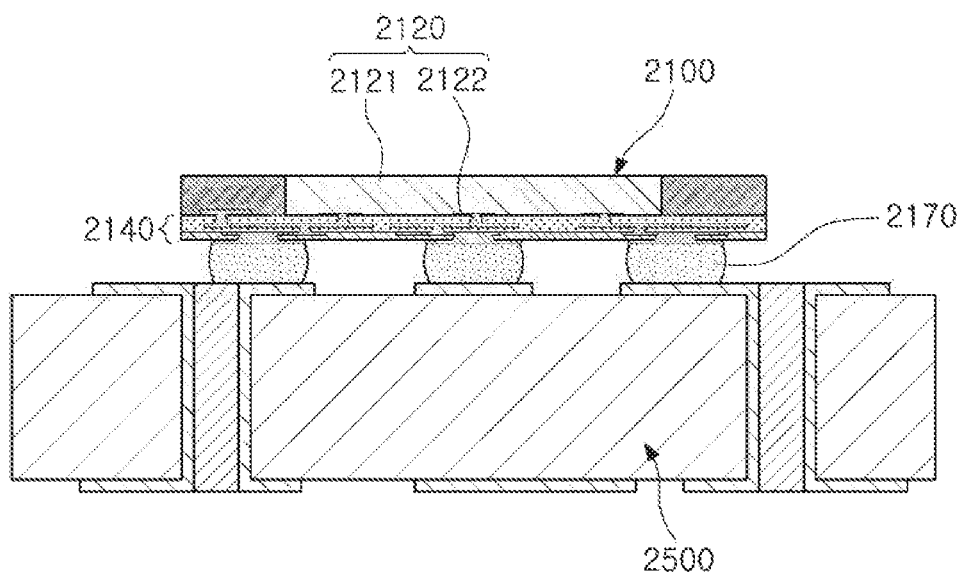
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the interconnection member 2140 formed on the semiconductor chip 2120 and capable of redistributing the connection pads 2122 to a fan-out region outside of an area of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented to have a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type semiconductor package using a printed circuit board (PCB), and may solve a problem occurring due to occurrence of a warpage phenomenon.

Meanwhile, the fan-out semiconductor package refers to package technology for mounting the semiconductor chip on the main board of the electronic device, or the like, as described above, and protecting the semiconductor chip from external impacts, and is conceptually different from a printed circuit board (PCB) such as an interposer substrate, or the like, having a scale, a purpose, and the like, different from those of the fan-out semiconductor package, and having the fan-in semiconductor package embedded therein.

A fan-out semiconductor package in which reliability of a via may be improved will be hereinafter described with reference to the drawings.

Figure 9:
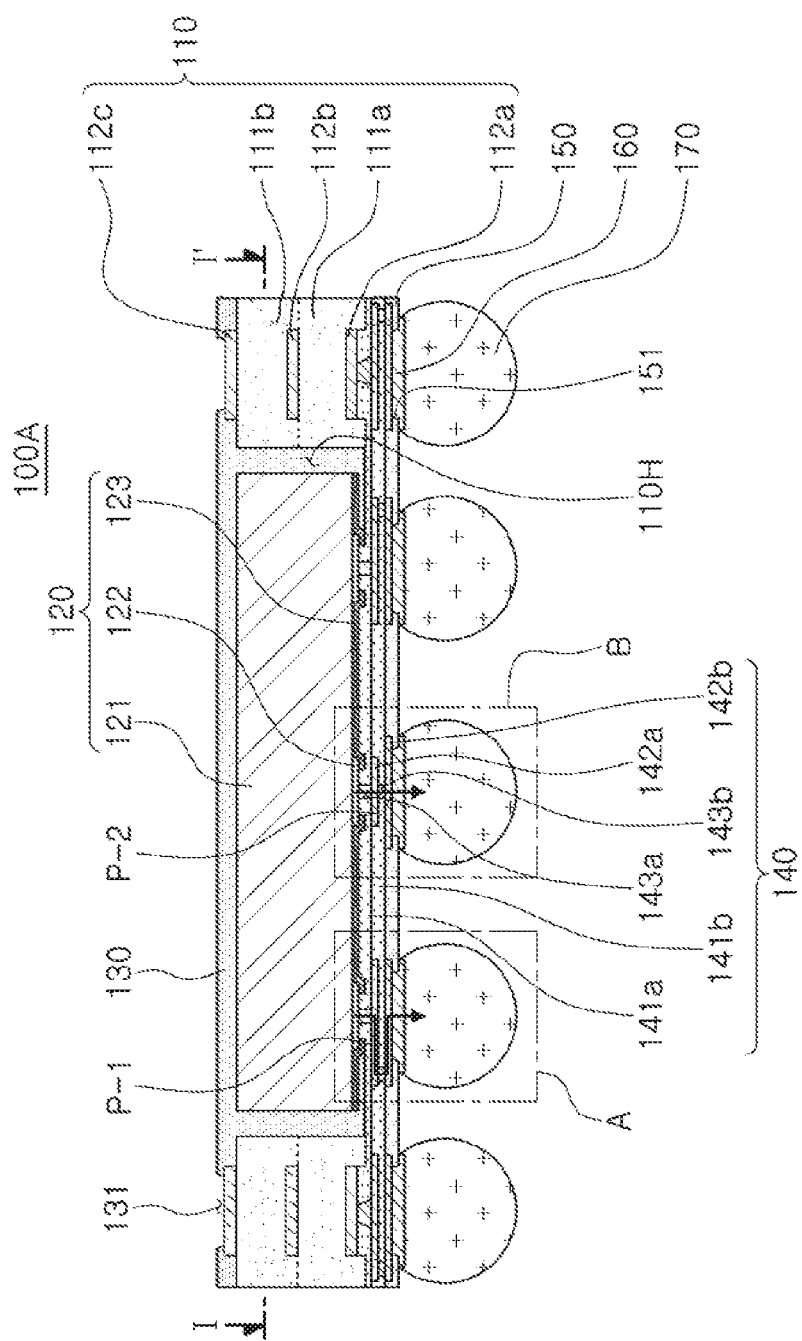
FIG. 9 is a schematic cross-sectional view illustrating an example of a fan-out semiconductor package.

FIG. 9 is a schematic cross-sectional view illustrating an example of a fan-out semiconductor package.

Figure 10:
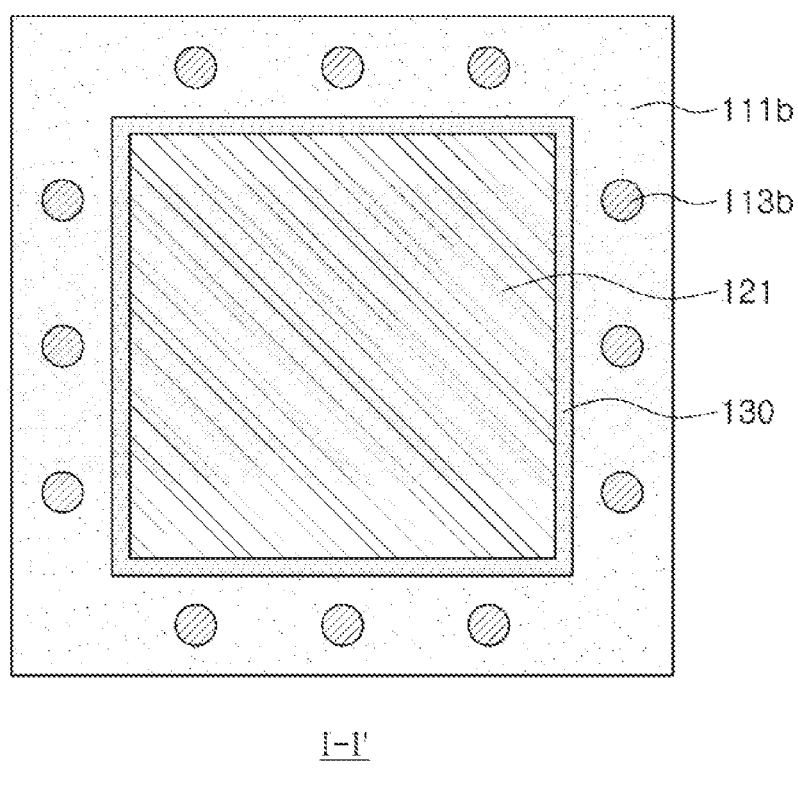
FIG. 10 is a schematic plan view taken along line I-I' of the fan-out semiconductor package of FIG. 9.

FIG. 10 is a schematic plan view taken along line I-I' of the fan-out semiconductor package of FIG. 9.

Figure 11A:
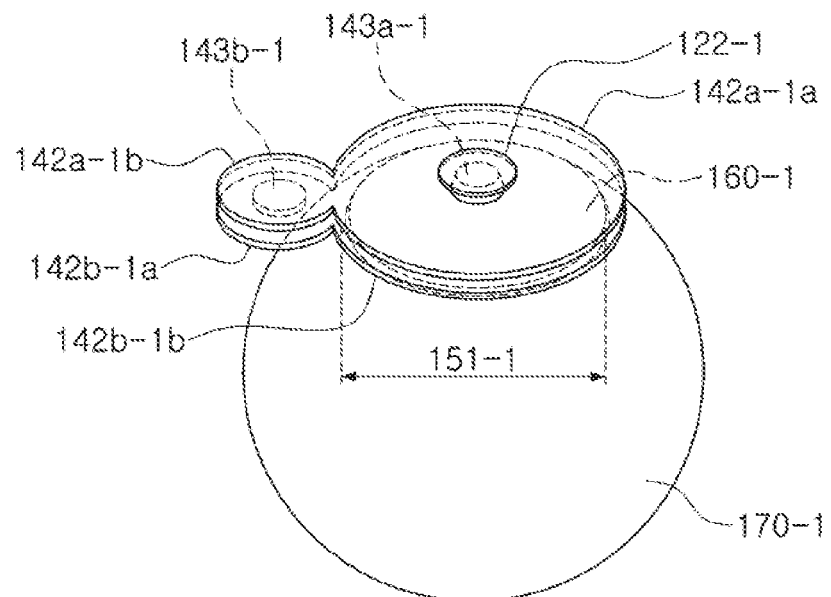
FIG. 11A is a schematic enlarged view according to an example of A of the fan-out semiconductor package of FIG. 9.

FIG. 11A is a schematic enlarged view according to an example of A of the fan-out semiconductor package of FIG. 9.

Figure 11B:
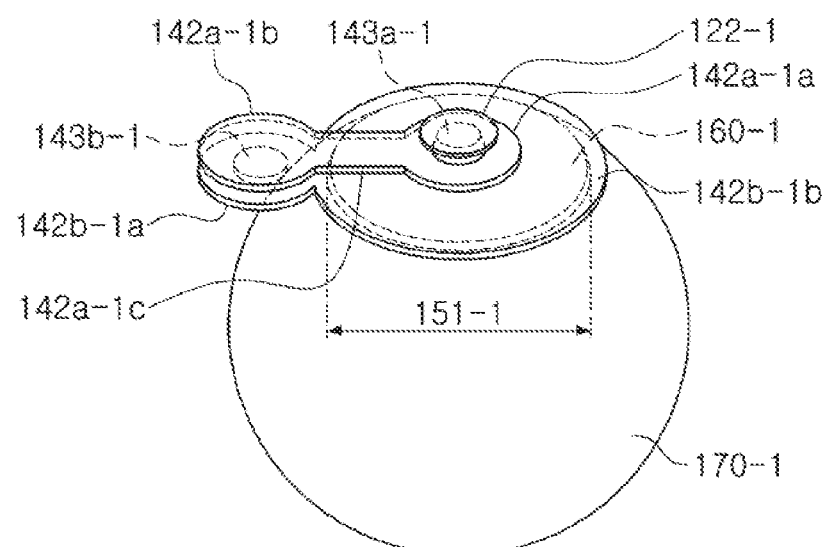
FIG. 11B is a schematic enlarged view according to another example of A of the fan-out semiconductor package of FIG. 9.

FIG. 11B is a schematic enlarged view according to another example of A of the fan-out semiconductor package of FIG. 9.

Figure 12:
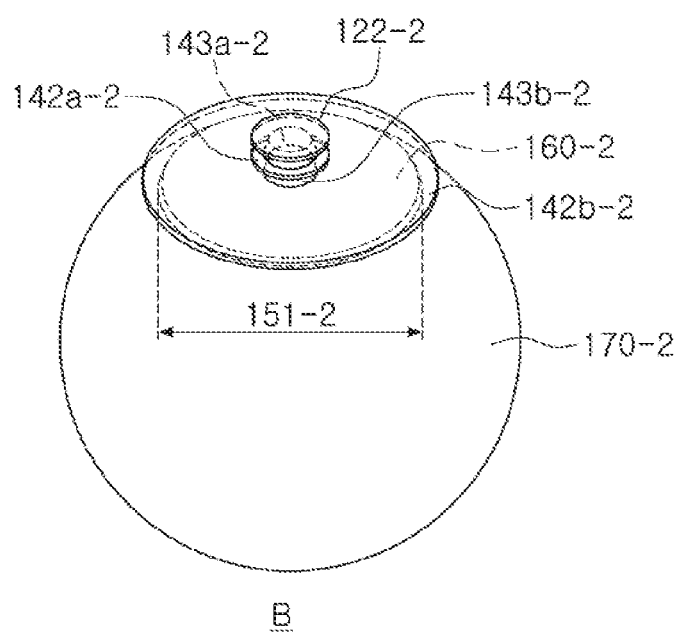
FIG. 12 is a schematic enlarged view according to an example of B of the fan-out semiconductor package of FIG. 9.

FIG. 12 is a schematic enlarged view according to an example of B of the fan-out semiconductor package of FIG. 9.

Referring to the drawings, a fan-out semiconductor package 100A according to an exemplary embodiment in the present disclosure may include a first interconnection member 110 having a through-hole 110H, a semiconductor chip 120 disposed in the through-hole 110H and having connection pads 122 disposed on one surface thereof, an encapsulant 130 encapsulating at least portions of the first interconnection member 110 and the semiconductor chip 120, a second interconnection member 140 disposed on the first interconnection member 110 and one surface of the semiconductor chip 120 and redistributing the connection pads 122 up to a fan-out region, a passivation layer 150 disposed on one surface of the second interconnection member 140 and having openings 151 exposing at least portions of connection terminal pads of the second interconnection member 140, an under-bump metal layer 160 disposed on the openings 151 of the passivation layer 150, and connection terminals 170 disposed on the under-bump metal layer 160 and electrically connected to the connection pads 122 through the second interconnection member 140.

In this case, at least one pair of connection pad 122-1 and connection terminal 170-1 of the connection pads 122 and the connection terminals 170 may be connected to each other by a first electrical pathway P-1 in the second interconnection member 140, including a first via 143a-1 connected to the connection pad 122-1, a first via pad 142a-1a connected to the first via 143a-1, a second via pad 142a-1b disposed on the same layer as a layer on which the first via pad 142a-1a is disposed and directly connected to the first via pad 142a-1a or to the first via pad 142a-1a through a wiring 142a-1c, a second via 143b-1 connected to the second via pad 142a-1b, a third via pad 142b-1a connected to the second via 143b-1, and a connection terminal pad 142b-1b disposed on the same layer as a layer on which the third via pad 142b-1a is disposed and directly connected to the third via pad 142b-1a. The first and second via pads 142a-1a and 142a-1b may be disposed on a layer different from the layer on which the connection terminal pad 142b-1b is disposed, and the third via pad 142b-1a may be disposed on the same layer as the layer on which the connection terminal pad 142b-1b is disposed. The first and second vias 143a-1 and 143b-1 may be disposed on layers different from each other.

The first via 143a-1 of the first electrical pathway P-1 may be disposed so that a central axis thereof is disposed in an inner region of the connection terminal pad 142b-1b or an opening 151-1. As described below, a distance between the central axis of the first via 143a-1 and a central axis of the connection terminal pad 142b-1b may be within ⅓ of a radius of the opening 151-1. The second via 143b-1 may be disposed so that a central axis thereof is disposed in an outer region of the connection terminal pad 142b-1b or the opening 151-1. The second and third via pads 142a-1b and 142b-1a connected to the second via 143b-1 may be disposed in the outer region of the opening 151-1. Stress may be reduced through the first electrical pathway P-1, as described below. Therefore, the first electrical pathway P-1 may be formed in a region in which stress is severe as described below, such as a corner of a region in which the semiconductor chip 120 is disposed.

The connection terminal pad 142b-1b may have a horizontal cross-sectional area wider than that of the third via pad 142b-1a directly connected to the connection terminal pad 142b-1b. Resultantly, a horizontal cross section of the connection terminal pad 142b-1b and the third via pad 142b-1a directly connected to each other may have, for example, a snowman shape. The horizontal cross section refers to a cross section in a plane in a direction perpendicular to a vertical direction of each component of the fan-out semiconductor package 100A in the accompanying drawings. In this case, reliability may be further improved. In a case in which the first and second via pads 141a-1a and 142a-1b are directly connected to each other, a horizontal cross section of the first and second via pads 141a-1a and 142a-1b may have, for example, a snowman shape. Alternatively, in a case in which the first and second via pads 141a-1a and 142a-1b are connected to each other by the wiring 142a-1c, a horizontal cross section of the first and second via pads 141a-1a and 142a-1b may have, for example, a dumbbell shape.

In addition, at least another pair of connection pad 122-2 and connection terminal 170-2 of the connection pads 122 and the connection terminals 170 may be connected to each other by a second electrical pathway P-2 in the second interconnection member 140, including a third via 143a-2 connected to the connection pad 122-2, a via pad 142a-2 connected to the third via 143a-2, a fourth via 143b-2 connected to the via pad 142a-2, and a connection terminal pad 142b-2 connected to the fourth via 143b-2. The via pad 142a-2 may be disposed on a layer different from layer on which the connection terminal pad 142b-2 is disposed. The third and fourth vias 143a-2 and 143b-2 may be disposed on layers different from each other.

The third and fourth vias 143a-2 and 143b-2 of the second electrical pathway P-2 may be disposed so that central axes thereof are disposed in an inner region of the connection terminal pad 142b-2 or an opening 151-2. The central axes of the third and fourth vias 143a-2 and 143b-2 may be disposed to substantially coincide with that of the opening 151-2. Here, the meaning of 'substantially' includes an error in a process. The second electrical pathway P-2 may not reduce stress, but may significantly reduce a wiring distance. Therefore, the second electrical pathway P-2 may be formed in a region in which stress is not severe other than a region in which stress is severe as described below, such as an internal region, or the like, of the semiconductor chip 120.

In general, in a case in which a fan-out semiconductor package is mounted directly on a main board, or the like, of an electronic device, reliability of connection terminals connecting the fan-out semiconductor package and the board to each other and vias in a second interconnection member connected to the connection terminals may be decreased due to stress generated owing to various causes. For example, warpages may be generated in the fan-out semiconductor package and the board due to a difference in a coefficient of thermal expansion (CTE) between a semiconductor chip and the main board. In this case, the warpage generated in the fan-out semiconductor package and the warpage generated in the board act in opposite directions, such that stress may be concentrated on the connection terminals connecting the fan-out semiconductor package and the board to each other, such as solder balls. This stress may cause a crack in the solder balls, and may be transferred into an interconnection member to generate delamination or a crack in vias in the interconnection member connected to connection pads of the semiconductor chip. In addition, the delamination of the vias in the interconnection member may also be generated due to heat generated when the semiconductor chip is turned on or off and stress generated when the semiconductor chip is cooled. As described above, temperature cycling reliability has been problematic.

On the other hand, in a case in which the vias 143a-1 and 143b-1 and the pads 142a-1a, 142a-1b, 142b-1a, and 142b-1b of the second interconnection member 140 are disposed so that stress may be reduced in a region in which the stress is concentrated as in the fan-out semiconductor package 100A according to the exemplary embodiment, a reliability problem may be improved. In addition, the vias 143a-2 and 143b-2 may be disposed in a form different from the abovementioned form, such as a stacked via form, in a region in which stress is less concentrated, and effects such as reliability improvement, rapid signal transfer, and the like, may thus be accomplished.

The respective components included in the fan-out semiconductor package 100A according to the exemplary embodiment will hereinafter be described below in more detail.

The first interconnection member 110 may support the fan-out semiconductor package 100A. In addition, the first interconnection member 110 may allow uniformity of a thickness of the encapsulant 130 to be easily secured. In addition, the first interconnection member 110 may provide a routing region to form a redistribution layer, thereby reducing the number of layers of the second interconnection member 140. Resultantly, a defect occurring in a process of forming the second interconnection member 140 may be solved. The first interconnection member 110 may have the through-hole 110H. The through-hole 110H may have the semiconductor chip 120 disposed therein to be spaced apart from the first interconnection member 110 by a predetermined distance. That is, side surfaces of the semiconductor chip 120 may be surrounded by the first interconnection member 110. However, a form of the first interconnection member 110 is not limited thereto, but may be variously modified into other forms.

The first interconnection member 110 may include a first insulating layer 111a contacting the second interconnection member 140, a first redistribution layer 112a contacting the second interconnection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. Since the first interconnection member 110 may include a large number of redistribution layers 112a, 112b, and 112c, the second interconnection member 140 may be further simplified. Therefore, a decrease in a yield depending on a defect occurring in a process of forming the second interconnection member 140 may be improved. Since the first redistribution layer 112a is embedded in the first insulating layer 111a, an insulating distance of an insulating layer 141a of the second interconnection member 140 may be relatively constant. The first redistribution layer 112a may be recessed in the first insulating layer 111a, such that a lower surface of the first insulating layer 111a may have a step with respect to a lower surface of the first redistribution layer 112a. Therefore, a phenomenon that a material of the encapsulant 130 is bled to the first redistribution layer 112a may be prevented. The first to third redistribution layers 112a, 112b, and 112c may be electrically connected to each other by first via layers (not illustrated) and second via layers 113b penetrating through the first and second insulating layers 111a and 111b.

Materials of the first and second insulating layers 111a and 111b are not particularly limited as long as the first and second insulating layers 111a and 111b may support the fan-out semiconductor package. For example, an insulating material may be used as materials of the first and second insulating layers 111a and 111b. In this case, a thermosetting resin such as an epoxy resin, a thermoplastic resin such as a polyimide resin, a resin having a reinforcement material such as a glass cloth or an inorganic filler impregnated in the thermosetting resin and the thermoplastic resin, such as prepreg, Ajinomoto Build up Film (ABF), FR-4, Bismaleimide Triazine (BT), or the like, may be used as the insulating material. Alternatively, a photoimagable dielectric (PID) resin may also be used as the insulating material.

The redistribution layers 112a, 112b, and 112c may serve to redistribute the connection pads 122 of the semiconductor chip 120, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 112a, 112b, and 112c. The redistribution layers 112a, 112b, and 112c may have various functions depending on designs of layers corresponding thereto. For example, the redistribution layers 112a, 112b and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 112a, 112b, and 112c may include via pads, connection terminal pads, and the like. A surface treatment layer may further be formed on portions of the redistribution layer 112c exposed from the redistribution layers 112a, 112b, and 112c through openings formed in the encapsulant 130, if necessary. The surface treatment layer is not particularly limited as long as it is known in the related art, but may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The first via layers (not illustrated) and the second via layers 113b may electrically connect the redistribution layers 112a and 112b formed on different layers to each other, resulting in an electrical pathway in the first interconnection member 110. A conductive material such as copper (Cu), aluminum (Al), silver (Ag), tin (Sn), gold (Au), nickel (Ni), lead (Pb), titanium (Ti), or alloys thereof, may be used as a material of each of the first via layers (not illustrated) and the second via layers 113b. Each of the first via layers (not illustrated) and the second via layers 113b may be entirely filled with the conductive material, or the conductive material may also be formed along a wall of respective via holes. In addition, each of the first via layers (not illustrated) and the second via layers 113b may have all shapes known in the related art, such as a tapered shape, a cylindrical shape, and the like.

The semiconductor chip 120 may be an integrated circuit (IC) provided in an amount of several hundreds to several millions of elements or more integrated in a single chip. The IC may be a known semiconductor chip, for example, an application processor (AP) such as a central processor (for example, a CPU), a graphic processor (for example, a GPU), a digital signal processor, a cryptographic processor, a microprocessor, a microcontroller, or the like. Alternatively, the IC may be a power management IC (PMIC). The AP and the PMIC, which are the semiconductor chip 120, may be disposed together with each other in the through-hole 110H of the first interconnection member 110. Alternatively, the AP and the PMIC may be integrated with each other as a single chip and be disposed in the through-hole 110H of the first interconnection member 110.

The semiconductor chip 120 may include a body 121, the connection pads 122 formed on one surface of the body 121, and a passivation layer 123 formed on the body 121 and covering portions of the connection pads 122. The body 121 may be formed on the basis of, for example, an active wafer. In this case, silicon (Si), germanium (Ge), gallium arsenide (GaAs), or the like, may be used as a basic material of the body 121. The connection pads 122 may electrically connect the semiconductor chip 120 to other components, and a conductive material such as aluminum (Al), or the like, may be used as a material of each of the connection pads 122. The connection pads 122 may be redistributed by the second interconnection member 140, the first interconnection member 110, and the like. A surface of the semiconductor chip 120 on which the connection pads 122 are formed may be an active surface, and an opposite surface of the semiconductor chip 120 to the active surface may be an inactive surface. The passivation layer 123 may serve to protect the body 121 from external impact, and may be formed of, for example, an oxide film formed of SiO, etc., a nitride film formed of SiN, etc., or the like, or be formed of a double layer including an oxide film and a nitride film. In addition, an insulating layer, or the like, formed of SiO, etc., may be further disposed between the body 121 and the connection pads 122 or between the body 121 and the passivation layer 123.

The lower surface of the first redistribution layer 112a of the first interconnection member 110 may be disposed on a level above a lower surface of the connection pad 122 of the semiconductor chip 120. In addition, a distance between a redistribution layer 142a of the second interconnection member 140 and the first redistribution layer 112a of the first interconnection member 110 may be greater than that between the redistribution layer 142a of the second interconnection member 140 and the connection pad 122 of the semiconductor chip 120. Here, the first redistribution layer 112a may be recessed in the first insulating layer 111a. The second redistribution layer 112b of the first interconnection member 110 may be disposed on a level between the active surface and the inactive surface of the semiconductor chip 120. The first interconnection member 110 may be formed to a thickness corresponding to that of the semiconductor chip 120. Therefore, the second redistribution layer 112b formed in the first interconnection member 110 may be disposed on a level between the active surface and the inactive surface of the semiconductor chip 120.

The encapsulant 130 may be configured to protect the first interconnection member 110 or the semiconductor chip 120. An encapsulation form of the encapsulant 130 is not particularly limited, but may be a form in which the encapsulant 130 surrounds at least portions of the first interconnection member 110 or the semiconductor chip 120. For example, the encapsulant 130 may fill the first interconnection member 110, the other surface of the semiconductor chip 120, and a space between the first interconnection member 110 and the semiconductor chip 120 within the through-hole 110H. In addition, the encapsulant 130 may also fill at least a portion of a space between the passivation layer 123 of the semiconductor chip 120 and the second interconnection member 140. Meanwhile, the encapsulant 130 may fill the through-hole 110H to thus serve as an adhesive and reduce buckling of the semiconductor chip 120 depending on materials of the encapsulant 130. Openings opening at least portions of the second redistribution layer 112b formed on the other surface of the first interconnection member 110 may be formed in the encapsulant 130. The opened portions of the second redistribution layer 112b may be utilized as marking patterns. Alternatively, separate connection terminals, or the like, may be connected to the opened portions of the second redistribution layer 112b to thus be applied to a package-on-package structure, and a surface mount technology (SMT) component may be disposed on the opened portions of the second redistribution layer 112b.

The materials of the encapsulant 130 are not particularly limited, but may be, for example, an insulating material. In more detail, for example, ABF, or the like, that includes an inorganic filler and an insulating resin, but does not include a glass cloth may be used as a material of the encapsulant 130. In this case, a void problem or a delamination problem may be solved. Meanwhile, the inorganic filler may be a known inorganic filler, and the insulating resin may be a known epoxy resin, or the like. However, the inorganic filler and the insulating resin are not limited thereto.

The second interconnection member 140 may be configured to redistribute the connection pads 122 of the semiconductor chip 120. Several tens to several hundreds of connection pads 122 having various functions may be redistributed by the second interconnection member 140, and may be physically or electrically connected to an external source through connection terminals 170 to be described below depending on the functions. The second interconnection member 140 may include insulating layers 141a and 141b, redistribution layers 142a and 142b, and via layers 143a and 143b.

An insulating material may be used as a material of each of the insulating layers 141a and 141b. In this case, a photosensitive insulating material such as a photoimagable dielectric (PID) resin may also be used as the insulating material. In this case, each of the insulating layers 141a and 141b may be formed to have a smaller thickness, and a fine pitch of each of vias of the first via layers 143a and the second via layers 143b may be achieved more easily. Materials of the insulating layers 141a and 141b may be the same as each other or may be different from each other, if necessary. The insulating layers 141a and 141b may be integrated with each other depending on processes, so that a boundary therebetween may not be readily apparent.

The redistribution layers 142a and 142b may substantially serve to redistribute the connection pads 122, and a conductive material such as copper (Cu), aluminum (Al), silver (Ag), tin (Sn), gold (Au), nickel (Ni), lead (Pb), titanium (Ti), or alloys thereof, may be used as a material of each of the redistribution layers 142a and 142b. The redistribution layers 142a and 142b may have various functions depending on designs of layers corresponding thereto. For example, the redistribution layers 142a and 142b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142a and 142b may include via pads, connection terminal pads, and the like. A surface treatment layer (not illustrated) may further be formed on portions of a redistribution layer exposed from the redistribution layers 142a and 142b, if necessary. The surface treatment layer is not particularly limited as long as it is known in the related art, and may be formed by, for example, electrolytic gold plating, electroless gold plating, OSP or electroless tin plating, electroless silver plating, electroless nickel plating/substituted gold plating, DIG plating, HASL, or the like.

The via layers 143a and 143b may electrically connect the redistribution layers 142a and 142b, the connection pads 122, or the like, formed on different layers to each other, resulting in an electrical pathway in the fan-out semiconductor package 100A. A conductive material such as copper (Cu), aluminum (Al), silver (Ag), tin (Sn), gold (Au), nickel (Ni), lead (Pb), titanium (Ti), or alloys thereof, may be used as a material of each of the via layers 143a and 143b. Each of the via layers 143a and 143b may be entirely filled with the conductive material, or the conductive material may also be formed along a wall of each of vias unlike illustrated in the drawing. In addition, each of the via layers 143a and 143b may have all shapes known in the related art, such as a tapered shape, a cylindrical shape, and the like.

Thicknesses of the redistribution layers 112a, 112b, and 112c of the first interconnection member 110 may be greater than those of the redistribution layers 142a and 142b of the second interconnection member 140. Since the first interconnection member 110 may have a thickness equal to or greater than that of the semiconductor chip 120, the redistribution layers 112a, 112b, and 112c may be formed to be large depending on a scale of the first interconnection member 110. On the other hand, the redistribution layers 142a and 142b of the second interconnection member 140 may be formed to be relatively small for thinness.

The passivation layer 150 may be additionally configured to protect the second interconnection member 140 from external physical or chemical damage. The passivation layer 150 may have the openings 151 exposing at least portions of any one of the redistribution layers 142a and 142b of the second interconnection member 140. The openings 151 may expose the entirety or only a portion of a surface of the redistribution layer 142b, and may also expose side surfaces of the redistribution layer 142b in some cases. In a case in which the passivation layer 150 is not formed and the second interconnection member 140 has a plurality of insulating layers, the openings 151 may be formed in the outermost insulating layer of the plurality of insulating layers. The respective openings 151 may also be formed of a plurality of vias in some cases.

A material of the passivation layer 150 is not particularly limited, but may be a photosensitive insulating material such as a PID resin. Alternatively, a solder resist may also be used as a material of the passivation layer 150. Alternatively, an insulating resin that does not include a glass cloth, but has a filler impregnated therein, such as ABF including an inorganic filler and an epoxy resin, or the like, may be used as the material of the passivation layer 150. In a case in which the ABF, or the like, is used as the material of the passivation layer 150, a material satisfying Equations 1 to 4 may be easily selected. In this case, board level reliability of the electronic component package may be improved.

Elastic Modulus×Coefficient of Thermal Expansion≤230 GPa·ppm/°C.            Equation 1:

Thickness≥10 μm            Equation 2:

Surface Roughness≥1 nm            Equation 3:

Moisture Absorption Ratio≤1.5%            Equation 4:

The under-bump metal layer 160 may be additionally configured to improve connection reliability of connection terminals 170 to be described below and improve board level reliability of the fan-out semiconductor package 100A. The under-bump metal layer 160 may be disposed on walls in the openings 151 of the passivation layer 150 and the exposed redistribution layer 142b of the second interconnection member 140. The under-bump metal layer 160 may be formed by a metallization method using a known metal.

The connection terminals 170 may be configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material such as a solder, or the like. However, this is only an example, and a material of each of the connection terminals 170 is not limited thereto. Each of the connection terminals 170 may be a land, a ball, a pin, or the like. The connection terminal 170 may be formed of multiple layers or a single layer. When the connection terminals 170 are formed of the multiple layers, the connection terminals 170 may include a copper pillar and a solder. When the connection terminals 170 are formed of the single layer, the connection terminals 170 may include a tin-silver solder or copper. However, this is only an example, and the connection terminals 170 are not limited thereto. The number, interval, dispositional form, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of several tens to several thousands or more or several tens to several thousands or less.

At least one of the connection terminals 170 may be disposed in a fan-out region. The fan-out region is a region except for the region in which the semiconductor chip 120 is disposed. That is, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have price competitiveness.

Although not illustrated in the drawings, a metal layer may be further disposed on an inner wall of the through-hole 110H of the first interconnection member 110, if necessary. That is, the side surfaces of the semiconductor chip 120 may also be surrounded by the metal layer. Heat generated from the semiconductor chip 120 may be effectively radiated in an upward or downward direction of the fan-out semiconductor package 100A through the metal layer, and electromagnetic waves may be effectively blocked by the metal layer. If necessary, a plurality of semiconductor chips may be disposed in the through-hole 110H of the first interconnection member 110, and the number of through-holes 110H of the first interconnection member 110 may be plural and semiconductor chips may be disposed in the through-holes, respectively. In addition, separate passive components such as a condenser, an inductor, and the like, may be disposed together with the semiconductor chip in the through-hole 110H. In addition, a surface mount technology (SMT) component may be mounted on the passivation layer 150.

Figure 13:
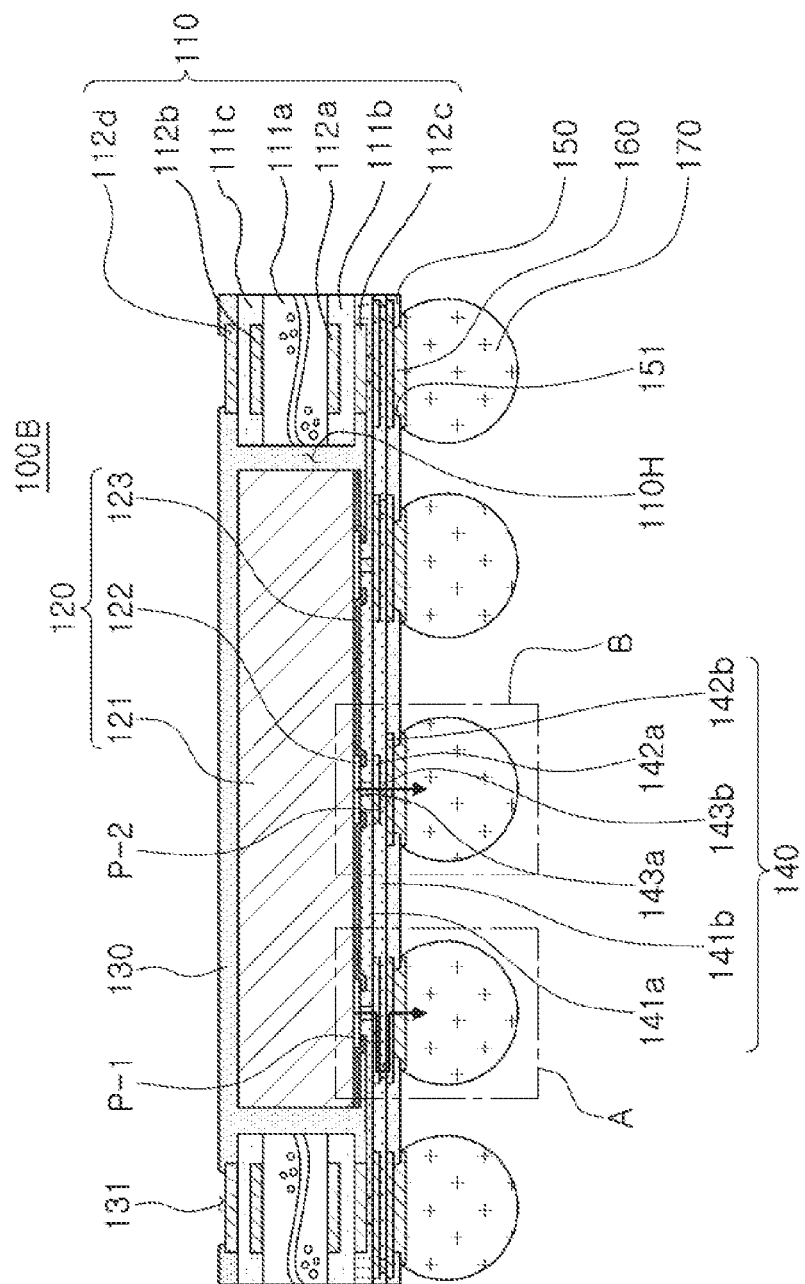
FIG. 13 is a schematic cross-sectional view illustrating another example of a fan-out semiconductor package.

FIG. 13 is a schematic cross-sectional view illustrating another example of a fan-out semiconductor package.

Referring to the drawing, in a fan-out semiconductor package 100B according to another exemplary embodiment in the present disclosure, a first interconnection member 110 may include a first insulating layer 111a, a first redistribution layer 112a and a second redistribution layer 112b disposed on both surfaces of the first insulating layer 111a, respectively, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to each other by first to third via layers (not illustrated) penetrating through the first to third insulating layers 111a, 111b, and 111c.

The first insulating layer 111a may have a thickness greater than those of the second insulating layer 111b and the third insulating layer 111c. The first insulating layer 111a may basically be relatively thick in order to maintain rigidity, and the second and third insulating layers 111b and 111c may be disposed in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a glass cloth, an inorganic filler, and an insulating resin, and the second insulating layer 111b and the third insulating layer 111c may be an ABF or a photosensitive insulating film including an inorganic filler and an insulating resin. However, the materials of the first insulating layer 111a and the second and third insulating layers 111b and 111c are not limited thereto.

A lower surface of the third redistribution layer 112c of the first interconnection member 110 may be disposed on a level below a lower surface of the connection pad 122 of the semiconductor chip 120. In addition, a distance between a redistribution layer 142a of the second interconnection member 140 and the third redistribution layer 112c of the first interconnection member 110 may be smaller than that between the redistribution layer 142a of the second interconnection member 140 and the connection pads 122 of the semiconductor chip 120. Here, the third redistribution layer 112c may be disposed on the second insulating layer 111b in protruding form, resulting in contacting the second interconnection member 140.

The first redistribution layer 112a and the second redistribution layer 112b of the first interconnection member 110 may be disposed on a level between an active surface and an inactive surface of the semiconductor chip 120. The first interconnection member 110 may be formed to a thickness corresponding to that of the semiconductor chip 120. Therefore, the first redistribution layer 112a and the second redistribution layer 112b formed in the first interconnection member 110 may be disposed on a level between the active surface and the inactive surface of the semiconductor chip 120.

Thicknesses of the redistribution layers 112a, 112b, 112c, and 112d of the first interconnection member 110 may be greater than those of the redistribution layers 142a and 142b of the second interconnection member 140. Since the first interconnection member 110 may have a thickness equal to or greater than that of the semiconductor chip 120, the redistribution layers 112a, 112b, 112c, and 112d may also be formed to be large. On the other hand, the redistribution layers 142a and 142b of the second interconnection member 140 may be formed to be relatively small for thinness.

A description, or the like, of configurations other than the abovementioned configuration, such as a description of a first electrical pathway P-1 and a second electrical pathway P-2, a description of region A and region B, or the like, may overlap the description provided above, and is thus omitted.

Figure 14:
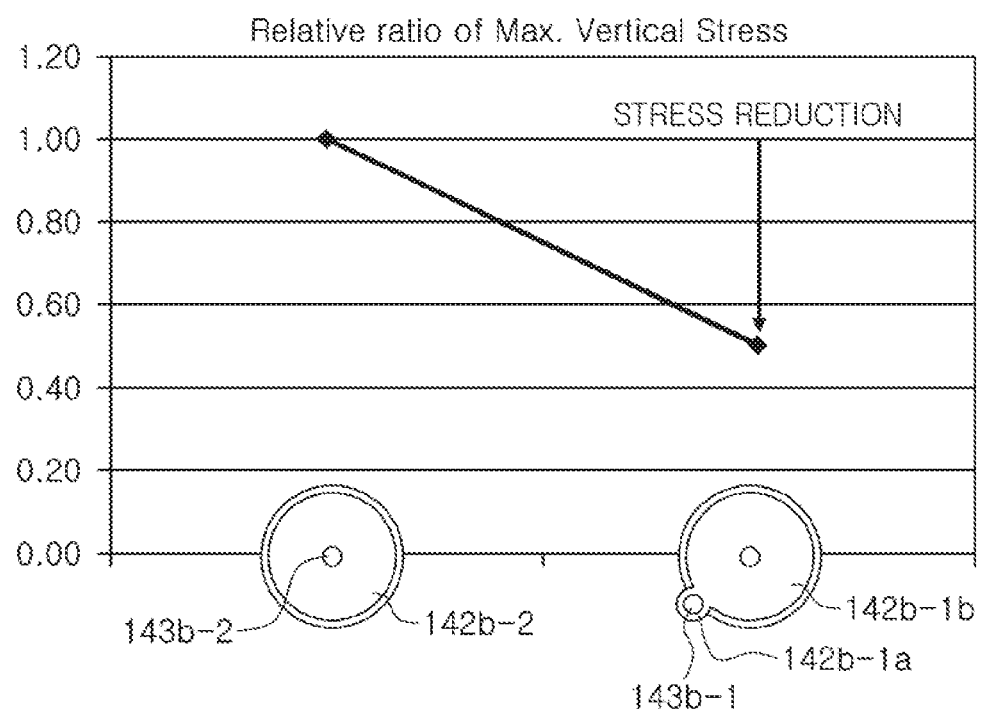
FIG. 14 is a schematic view illustrating a stress reducing effect in a case in which a central axis of a via is disposed in an outer region of a connection terminal pad or an opening.

FIG. 14 is a schematic view illustrating a stress reducing effect in a case in which a central axis of a via is disposed in an outer region of a connection terminal pad or an opening.

Referring to the drawing, it may be appropriated that a stress reducing effect is significantly larger in a case in which a via 143b-1 in the second interconnection member 140 is disposed so that a central axis thereof is formed in an outer region of a connection terminal pad 142b-1b or an opening 151-1 as in the fan-out semiconductor package 100A according to the exemplary embodiment than in a case in which a via 143b-2 is disposed so that a central axis thereof substantially coincides with that of a connection terminal pad 142b-1b or an opening 151-1.

Figure 15A:
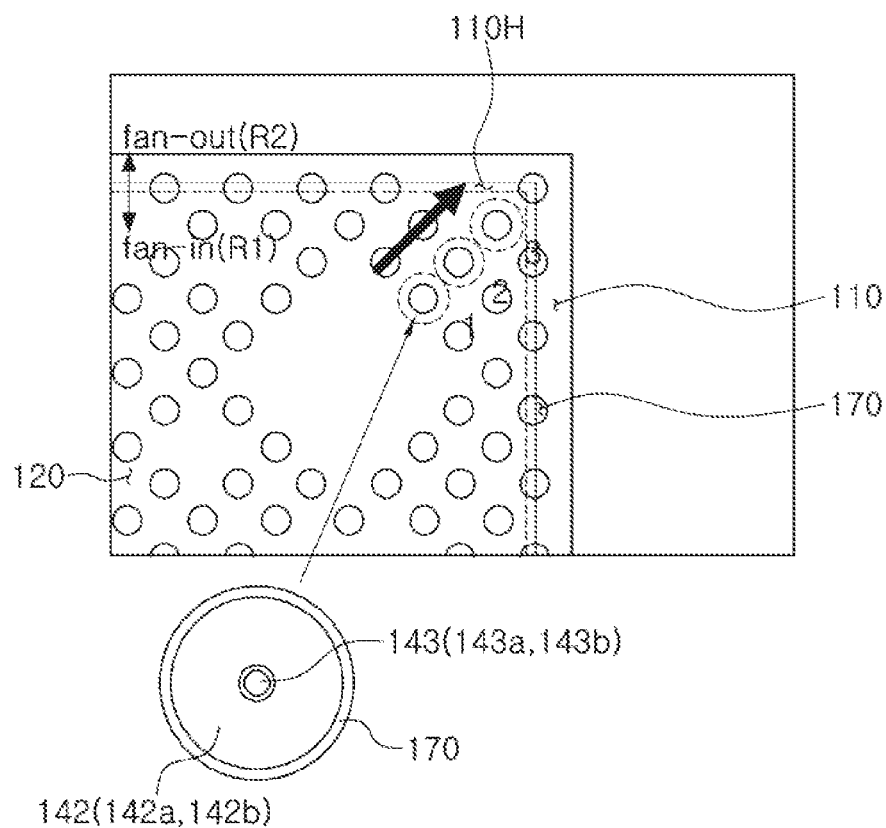
FIGS. 15A and 15B are schematic views illustrating relative magnitudes of stress applied to vias at positions within a fan-out semiconductor package.
Figure 15B:
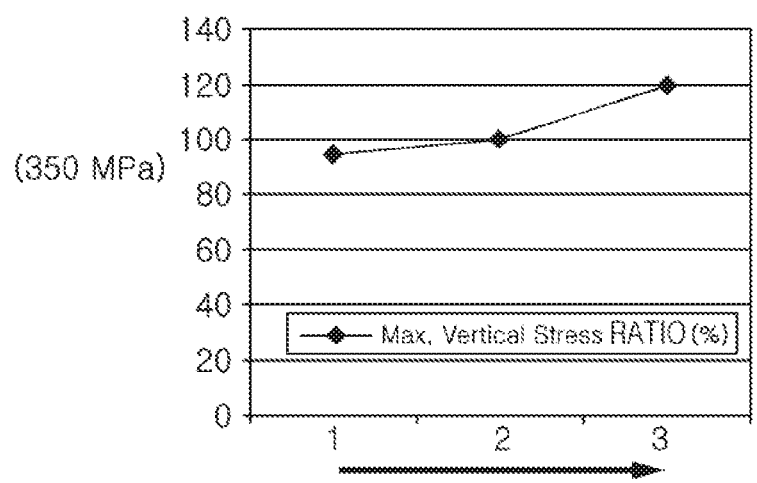

FIGS. 15A and 15B are schematic views illustrating relative magnitudes of stress applied to vias at positions within a fan-out semiconductor package.

Referring to the drawings, the second interconnection member 140 may include a fan-in region R1 corresponding to a region in which the semiconductor chip 120 is disposed and a fan-out region R2 surrounding the fan-in region R1. In this case, it may be appreciated that stress applied to vias in the second interconnection member is significantly increased in an outward direction in the fan-in region R1. For example, the stress may be severe particularly in four corner portions of the fan-in region R1. Therefore, the first electrical pathways P-1 that may reduce the stress as described above may be designed in at least the corner portions of the fan-in region R1. Similarly, stress applied to vias in the second interconnection member may be significantly increased in an outward direction in the fan-out region R2. Therefore, electrical pathways that may reduce the stress as described above may also be designed in at least corner portions of the fan-out region R2, but are not limited thereto. The second electrical pathways P-2 that may significantly reduce a wiring distance may be designed in a region in which stress is not severe, such as an internal region of the fan-in region R1, or the like.

Figure 16:
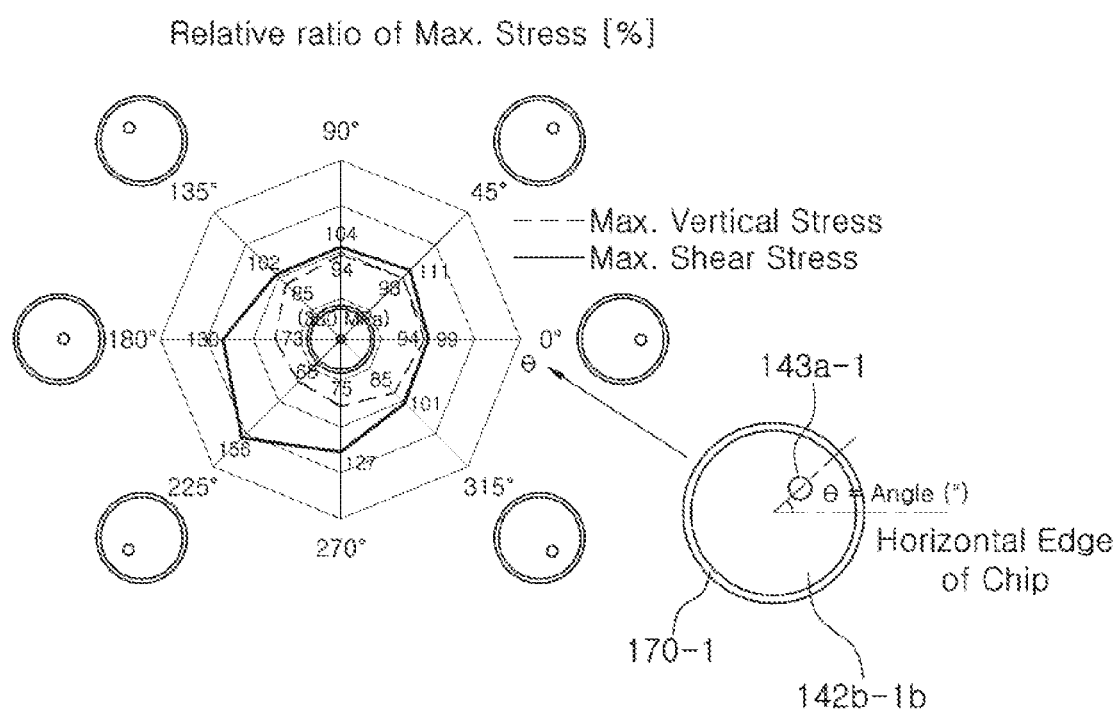
FIG. 16 is a schematic view illustrating stress depending on a distance between a central axis of a via connected to a connection pad of a semiconductor chip and a central axis of a connection terminal pad or an opening.

FIG. 16 is a schematic view illustrating stress depending on a distance between a central axis of a via connected to a connection pad of a semiconductor chip and a central axis of a connection terminal pad or an opening.

Referring to the drawing, it may be appreciated that in a case in which first and second vias 143a-1 and 143b-1 are disposed so that central axes thereof are misaligned with each other as in the fan-out semiconductor package 100A according to the exemplary embodiment, a stress reducing effect may be increased as misalignment between the central axis of the first via 143a-1 positioned at an upper portion in the drawing and a central axis of the connection terminal pad 142b-1b or the opening 151-1 is reduced. For example, it may be appreciated that in a case in which a distance between the central axis of the first via 143a-1 and the central axis of the connection terminal pad 142b-1b or the opening 151-1 is within ⅓ of a radius of the opening 151-1, a stress level of 120% or less may be maintained.

As set forth above, according to the exemplary embodiment in the present disclosure, a fan-out semiconductor package in which reliability of a via may be improved may be provided.

While exemplary embodiments have been shown and described above, it will be apparent to those skilled in the art that modifications and variations could be made without departing from the scope of the present invention as defined by the appended claims.

What is claimed is:
1. A fan-out semiconductor package comprising:
a semiconductor chip having an active surface having a connection pad disposed thereon and an inactive surface opposing the active surface;
an encapsulant encapsulating at least a portion of the inactive surface of the semiconductor chip;
a second interconnection member disposed on the active surface of the semiconductor chip; and
a connection terminal disposed on the second interconnection member,
wherein the second interconnection member includes redistribution layers electrically connected to the connection pad of the semiconductor chip, and
the connection pad and the connection terminal are electrically connected by an electrical pathway in the second interconnection member, the electrical pathway including a first via connection to the connection pad and having a central axis disposed in an inner region of a connection terminal pad connected to the connection terminal and a second via connected to a via pad formed on a layer on which the connection terminal pad is disposed and having a central axis disposed in an outer region of the connection terminal pad.

2. The fan-out semiconductor package of claim 1, wherein the second interconnection member includes a fan-in region corresponding to a region in which the semiconductor chip is disposed and a fan-out region surrounding the fan-in region, and the electrical pathway is disposed in the fan-in region.

3. The fan-out semiconductor package of claim 2, wherein the electrical pathway is formed in at least a corner of the fan-in region.

4. The fan-out semiconductor package of claim 1, wherein the via pad is directly connected to the connection terminal pad.

5. The fan-out semiconductor package of claim 4, wherein the via pad and the connection terminal pad are connected to each other to form a horizontal cross-sectional form in a shape of a snowman, in which a radius from the central axis of the via pad to an outer edge of the via pad is less than a radius from a central axis of the connection terminal pad to an outer edge of the connection terminal pad.

6. The fan-out semiconductor package of claim 1, wherein the electrical pathway further includes a first via pad disposed on a layer different from the layer on which the connection terminal pad is disposed and connected to the first via and a second via pad disposed on the layer on which the first via pad is disposed and connected to the second via, and the first via pad and the second via pad are directly connected to each other or are connected to each other by a wiring.

7. The fan-out semiconductor package of claim 1, further comprising a passivation layer disposed between the second interconnection member and the connection terminal and having an opening exposing at least a portion of the connection terminal pad, wherein the central axis of the first via is disposed in an inner region of the opening, and the central axis of the second via is disposed in an outer region of the opening.

8. The fan-out semiconductor package of claim 7, wherein a distance between a central axis of the connection terminal pad and the central axis of the first via is within ⅓ of a radius of the opening.

9. The fan-out semiconductor package of claim 1, further comprising a first interconnection member having a through-hole, wherein the semiconductor chip is disposed in the through-hole of the first interconnection member, the encapsulant encapsulates at least a portion of the first interconnection member, the second interconnection member is disposed on the first interconnection member, the first interconnection member includes redistribution layers electrically connected to the connection pad of the semiconductor chip, and wherein the first interconnection member includes a first insulating layer, a first redistribution layer contacting the second interconnection member and embedded in the first insulating layer, and a second redistribution layer disposed on another surface of the first insulating layer opposing one surface of the first insulating layer in which the first redistribution layer is embedded.

10. The fan-out semiconductor package of claim 9, wherein the first interconnection member further includes a second insulating layer disposed on the first insulating layer and covering the second redistribution layer and a third redistribution layer disposed on the second insulating layer.

11. The fan-out semiconductor package of claim 10, wherein the second redistribution layer is disposed on a level between the active surface and the inactive surface of the semiconductor chip.

12. The fan-out semiconductor package of claim 9, wherein a distance between a redistribution layer of the second interconnection member and the first redistribution layer is greater than that between the redistribution layer of the second interconnection member and the connection pad.

13. The fan-out semiconductor package of claim 9, wherein the first redistribution layer has a thickness greater than that of the redistribution layer of the second interconnection member.

14. The fan-out semiconductor package of claim 9, wherein a lower surface of the first redistribution layer is disposed on a level above a lower surface of the connection pad.

15. The fan-out semiconductor package of claim 1, further comprising a first interconnection member having a through-hole, wherein the semiconductor chip is disposed in the through-hole of the first interconnection member, the encapsulant encapsulates at least a portion of the first interconnection member, the second interconnection member is disposed on the first interconnection member, the first interconnection member includes redistribution layers electrically connected to the connection pad of the semiconductor chip, and wherein the first interconnection member includes a first insulating layer, a first redistribution layer and a second redistribution layer disposed on both surfaces of the first insulating layer, respectively, a second insulating layer disposed on the first insulating layer and covering the first redistribution layer, and a third redistribution layer disposed on the second insulating layer.

16. The fan-out semiconductor package of claim 15, wherein the first interconnection member further includes a third insulating layer disposed on the first insulating layer and covering the second redistribution layer and a fourth redistribution layer disposed on the third insulating layer.

17. The fan-out semiconductor package of claim 15, wherein the first insulating layer has a thickness greater than that of the second insulating layer.

18. The fan-out semiconductor package of claim 15, wherein the third redistribution layer has a thickness greater than that of the redistribution layer of the second interconnection member.

19. The fan-out semiconductor package of claim 15, wherein the first redistribution layer is disposed on a level between the active surface and the inactive surface of the semiconductor chip.

20. The fan-out semiconductor package of claim 15, wherein a lower surface of the third redistribution layer is disposed on a level below a lower surface of the connection pad.

21. A fan-out semiconductor package comprising:

a semiconductor chip having an active surface having a connection pad disposed thereon and an inactive surface opposing the active surface;

an encapsulant encapsulating at least a portion of the inactive surface of the semiconductor chip;

a second interconnection member disposed on the active surface of the semiconductor chip; and a connection terminal disposed on the second interconnection member, wherein the second interconnection member includes redistribution layers electrically connected to the connection pad of the semiconductor chip, and the connection pad and the connection terminal are electrically connected by an electrical pathway in the second interconnection member, the electrical pathway including a first via connected to the connection pad and a second via connected to a via pad formed on a layer on which a connection terminal pad is disposed, a central axis of the first via being displaced laterally from a central axis of the second via.

22. The fan-out semiconductor package of claim 21, wherein the electrical pathway further includes a first via pad disposed on a layer different from the layer on which the connection terminal pad is disposed and connected to the first via and a second via pad disposed on the layer on which the first via pad is disposed and connected to the second via, and the first via pad and the second via pad are directly connected to each other or are connected to each other by a wiring.

23. The fan-out semiconductor package of claim 21, wherein the electrical pathway is disposed below a corner of the semiconductor chip.

* * * * *